United States Patent [19]
Ota et al.

[11] Patent Number: 5,329,479
[45] Date of Patent: Jul. 12, 1994

[54] DYNAMIC SEMICONDUCTOR MEMORIES

[75] Inventors: Yoshiji Ota, Tenri; Toshio Mimoto, Nara, both of Japan

[73] Assignee: Sharp Kabushiki Kaisha, Osaka, Japan

[21] Appl. No.: 154,442

[22] Filed: Feb. 8, 1988

Related U.S. Application Data

[63] Continuation of Ser. No. 80,210, Jul. 31, 1987, abandoned, which is a continuation of Ser. No. 742,106, Jun. 5, 1985, abandoned.

[30] Foreign Application Priority Data

Jun. 29, 1984 [JP] Japan .................................. 59-136110

[51] Int. Cl.$^5$ ............................................. G11C 11/34
[52] U.S. Cl. ...................................... 365/149; 365/206
[58] Field of Search ................ 365/149, 206, 203, 205, 365/210

[56] References Cited

U.S. PATENT DOCUMENTS

| | | | |
|---|---|---|---|
| 4,103,342 | 7/1978 | Miersch et al. | 365/149 |
| 4,715,015 | 12/1987 | Mimoto et al. | 365/210 |
| 4,792,922 | 12/1988 | Mimoto et al. | 365/149 |

FOREIGN PATENT DOCUMENTS 55-12576   1/1980   Japan .................................. 365/149

OTHER PUBLICATIONS

V. L. Rideout et al., "Twin Cell Layout For High Speed Random-Access Memory", IBM Technical Disclosure Bulletin, vol. 20, No. 7, Dec. 1977, pp. 2879-2880.

Miyasaka et al., "Ideas and Progress in Sense Amplifiers-Key to the Design of Large Capacity MOS RAM" Nikkei Electronics, (1979) pp. 110-133.

Primary Examiner—Joseph A. Popek
Attorney, Agent, or Firm—Morrison & Foerster

[57] ABSTRACT

A dynamic semiconductor memory includes a pair of complementary bit lines with a significant difference in load capacitance, storage capacitors and a pair of transistors for specifying one of the storage capacitors. One end of each storage capacitor is connected to one of the bit lines through one of the transistors and the other end is connected to the other bit line through the other transistor.

2 Claims, 8 Drawing Sheets

DYNAMIC SEMICONDUCTOR MEMORIES

This is a continuation of application Ser. No. 080,210, filed Jul. 31, 1987, now abandoned, which is a continuation of Ser. No. 06/742,106, filed Jun. 5, 1085, now abandoned.

This invention relates to improved dynamic semiconductor memories and more particularly to dynamic semiconductor memories having a new structure that can improve the capability of a dynamic memory element.

Figure 8:
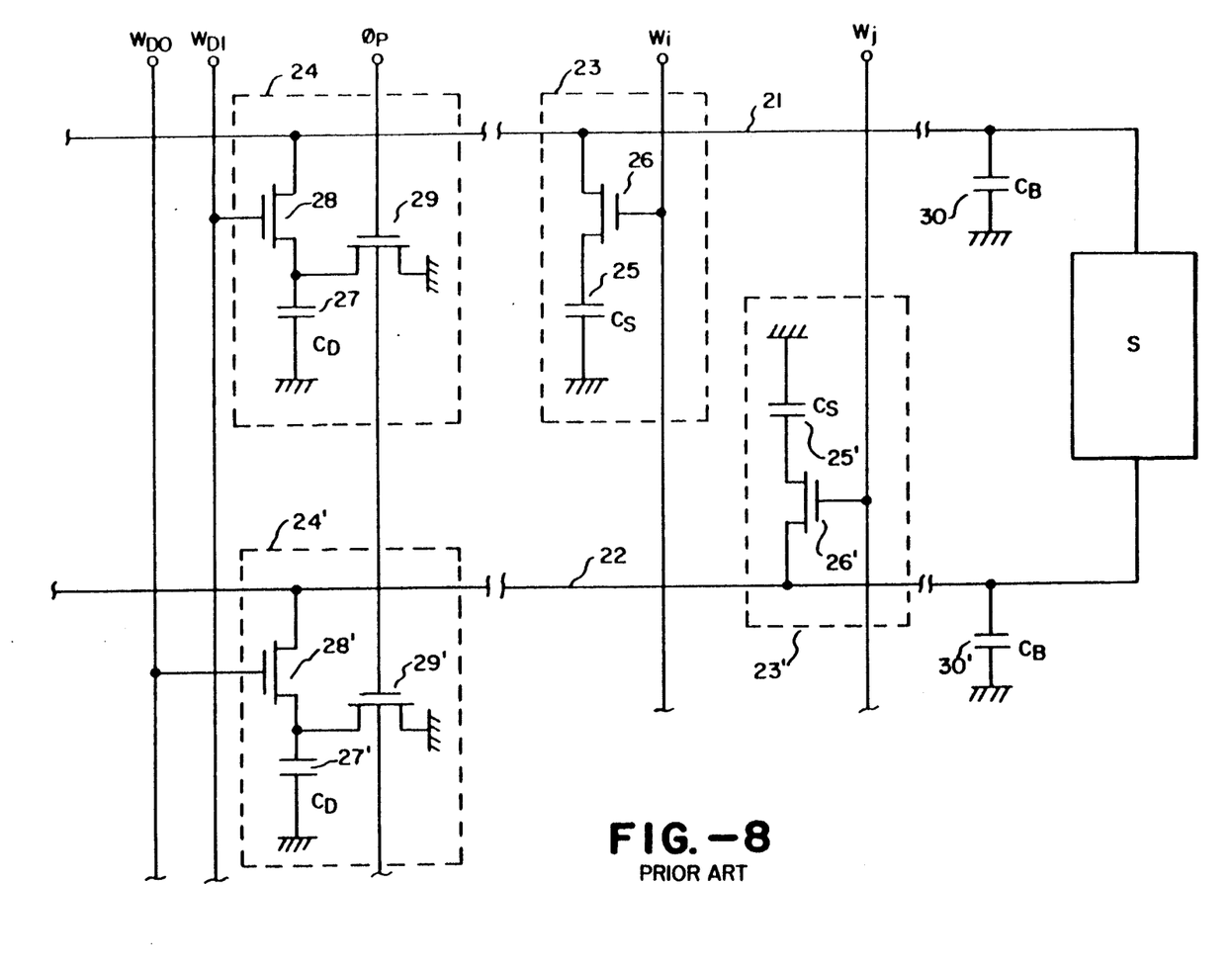
FIG. 8 is a circuit diagram of a dynamic memory of a conventional structure.

Dynamic memory elements with conventional memory cell structure had difficulties caused by fluctuations in the load capacity of complementary bit lines used for inputting and outputting information. As shown in FIG. 8, for example, the circuit for a conventional n-channel MOS dynamic memory element comprises a sense amplifier S, mutually complementary bit lines 21 and memory cells 23 and 23', dummy cells 24 and 24', word lines $W_i$ and $W_j$ and dummy word lines $W_{D0}$ and $W_{D1}$. $\phi_p$ indicates a precharge signal. Numerals 25 and 25' indicate storage capacitors and numerals 26 and 26' are transfer gates for selecting desired storage capacitors 25 and 25' and connecting them electrically to the bit lines 21 and 22. Capacitance of the capacitors 25 and 25' will be denoted by $C_S$. Numerals 27 and 27' indicate dummy storage capacitors of capacitance $C_D$. Numerals 28 and 28' are transfer gates for connecting the dummy storage capacitors 27 and 27' selectively to the bit lines 21 and 22. Numeral 29 and 29' are gates for initializing the dummy storage capacitors 27 and 27' during a precharge period. Numerals 30 and 30' are parasitic bit line capacitors with capacitance $C_B$.

Figure 9:
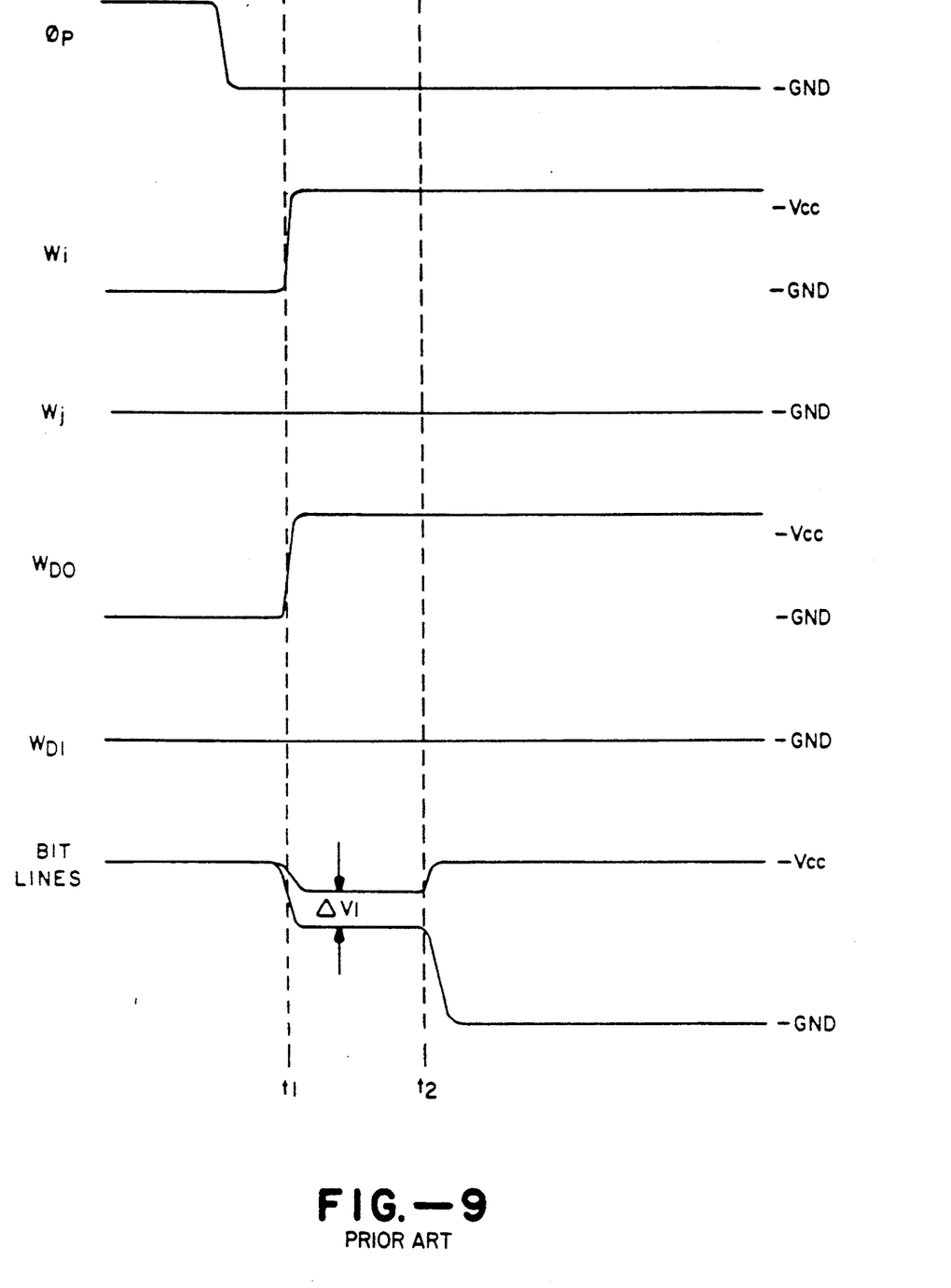
FIGS. 9 and 10 are timing diagrams for explaining the operation of the conventional dynamic memory of FIG. 8.
Figure 10:
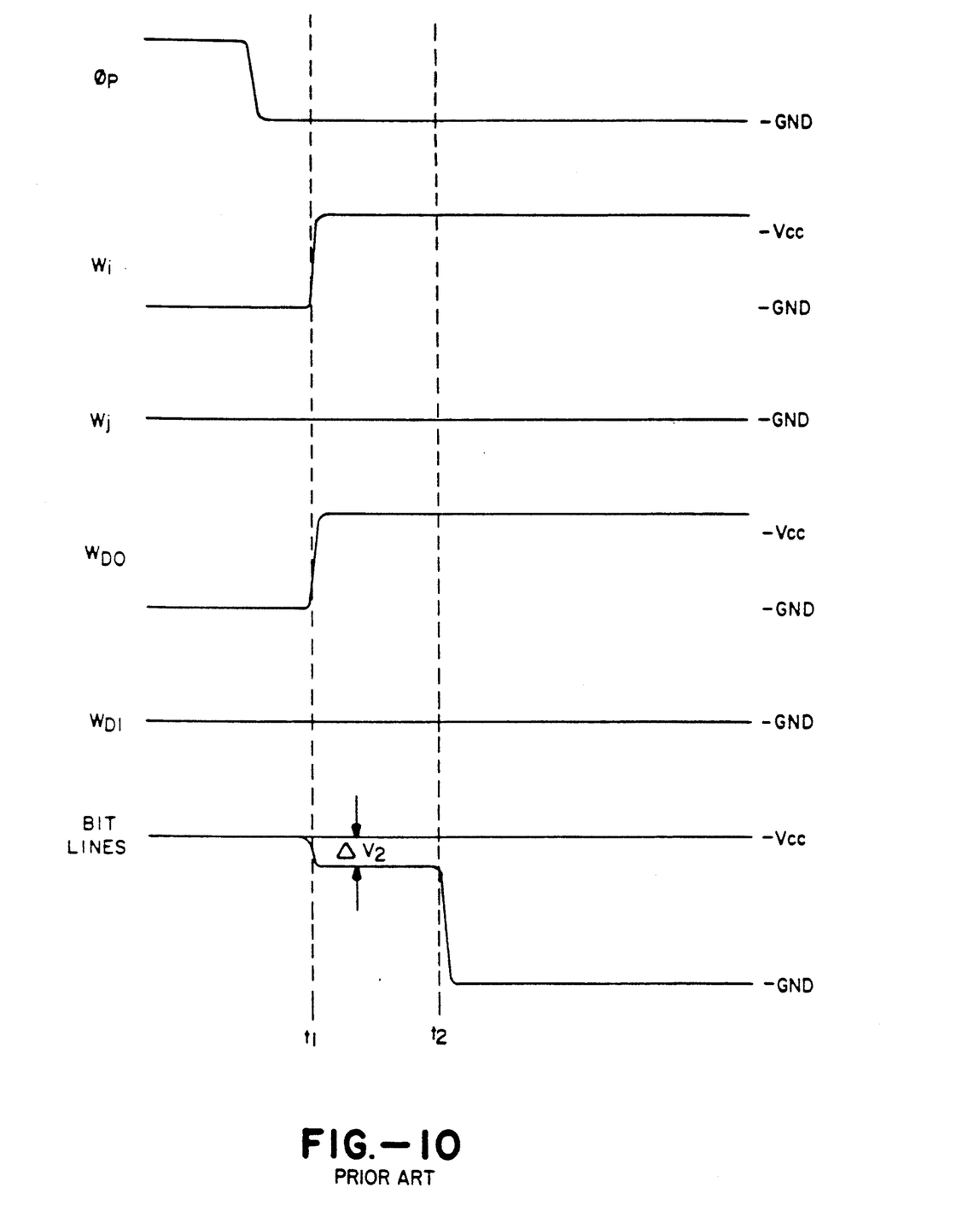

FIGS. 9 and 10 are timing diagrams for explaining the operation of the circuit of FIG. 8. FIG. 9 shows a situation where a low voltage (logical "0") is read from a memory cell. FIG. 10 shows a situation where a high voltage (logical "1") is read from a memory cell.

When the memory cell on the side of the first bit line 21 is selected in FIG. 8, the dummy cell 24' on the side of the second bit line 22 will be selected. When the memory cell on the side of the second bit line 22 is selected, the dummy cell 24 on the side of the first bit line 21 will be selected. In what follows, explanation will be presented for the situation wherein the word line $W_i$ and the dummy word line $W_{D0}$ are at high voltages and the memory cell 23 and the dummy cell 24' become selected. It will be assumed that voltages higher than the source voltage $V_{CC}$ are applied to the word line $W_i$ and the dummy word line $W_{D0}$. It will be assumed further that the bit lines 21 and 22 are precharged to the source voltage $V_{CC}$ during a precharge period when the precharge signal $\phi_p$ is at a high voltage.

Firstly, if the ground potential GND is stored in the storage capacitor 25 of the memory cell 23, when the precharge signal $\phi_p$ drops at the beginning of an active period and a word line signal is inputted at time $t_1$, the voltage $V_{B1}$ on the side of the first bit line 21 becomes $V_{B1} = C_B V_{CC}/(C_B + C_S)$. On the other hand, the voltage $V_{B2}$ on the second bit line 22 on the side of the dummy cell becomes $V_{B2} = C_B V_{CC}/(C_B + C_D)$. Accordingly, the differential voltage $\Delta V_1$ inputted to the sense amplifier S is given by $$\Delta V_1 = V_{B2} - V_{B1} = V_{CC}[C_B/(C_B+C_D) - C_B/(C_B+C_S)].$$

Secondly, if the source voltage $V_{CC}$ is stored in the storage capacitor 25 of the memory cell 23, the voltage $V_{B1}$ on the side of the first bit line 21 does not change so that $V_{B1} = V_{CC}$. The voltage $V_{B2}$ on the second bit line 22 on the side of the dummy cell is, as before, $V_{B2} = C_B V_{CC}/(C_B + C_D)$. Accordingly, the differential voltage $\Delta V_2$ inputted to the sense amplifier S becomes $$\Delta V_2 = V_{B1} - V_{B2} = V_{CC}[1 - C_B/(C_B+C_D)].$$

If the value $C_D$ of the dummy cell is determined in such a manner that the differential voltage inputted to the sense amplifier S will be the same in the two cases considered above, the differential voltage $\Delta V$ inputted to the sense amplifier S will become $$\Delta V = \Delta V_1 = \Delta V_2 = (\tfrac{1}{2}) C_S V_{CC}/(C_B+C_S). \quad \text{Eq. (1)}$$

This differential voltage will be amplified to a desired level after time $t_2$ when the sense amplifier S is activated.

In such a conventional circuit, balancing of load capacity between the bit lines 21 and 22 as well as the capacitance ratio between a dummy cell and a memory cell becomes extremely important, but it is difficult to maintain an optimum value because of the fluctuations caused in production processes. With the recent progress in manufacturing technologies, there have been efforts to realize large-scale memories but this necessarily causes the memory cell areas to become smaller, reducing the storage capacity inside memory cells. This gives rise to the problem that a differential voltage large enough for driving the sense amplifier may not be obtainable.

It is therefore an object of the present invention in view of the above to provide a dynamic semiconductor memory which can produce a much greater differential voltage than before if the same storage capacitors are used, or allows the storage capacity of memory cells to be extremely small for obtaining a differential voltage of the same magnitude as before, without imposing stringent requirements regarding the load capacity balance between the complementary bit lines so that the degree of freedom is increased for designing patterns.

It is another object of the present invention to provide a dynamic semiconductor memory which does not use any dummy cells so that there is no need to impose any requirement regarding the capacitance ratio between the dummy cell and the memory cell and that the memory array can be diminished and the peripheral circuits can be simplified.

The above and other objects of the present invention are attained by providing a dynamic semiconductor memory comprising mutually complementary first and second bit lines for inputting and outputting information, storage capacitor means for storing information and first and second selection means for specifying these storage capacitor means wherein memory cells are so structured that one end of said storage capacitor means is connected to the first bit line through the first selection means and the other end is connected to the second bit line through the second selection means.

Figure 1:
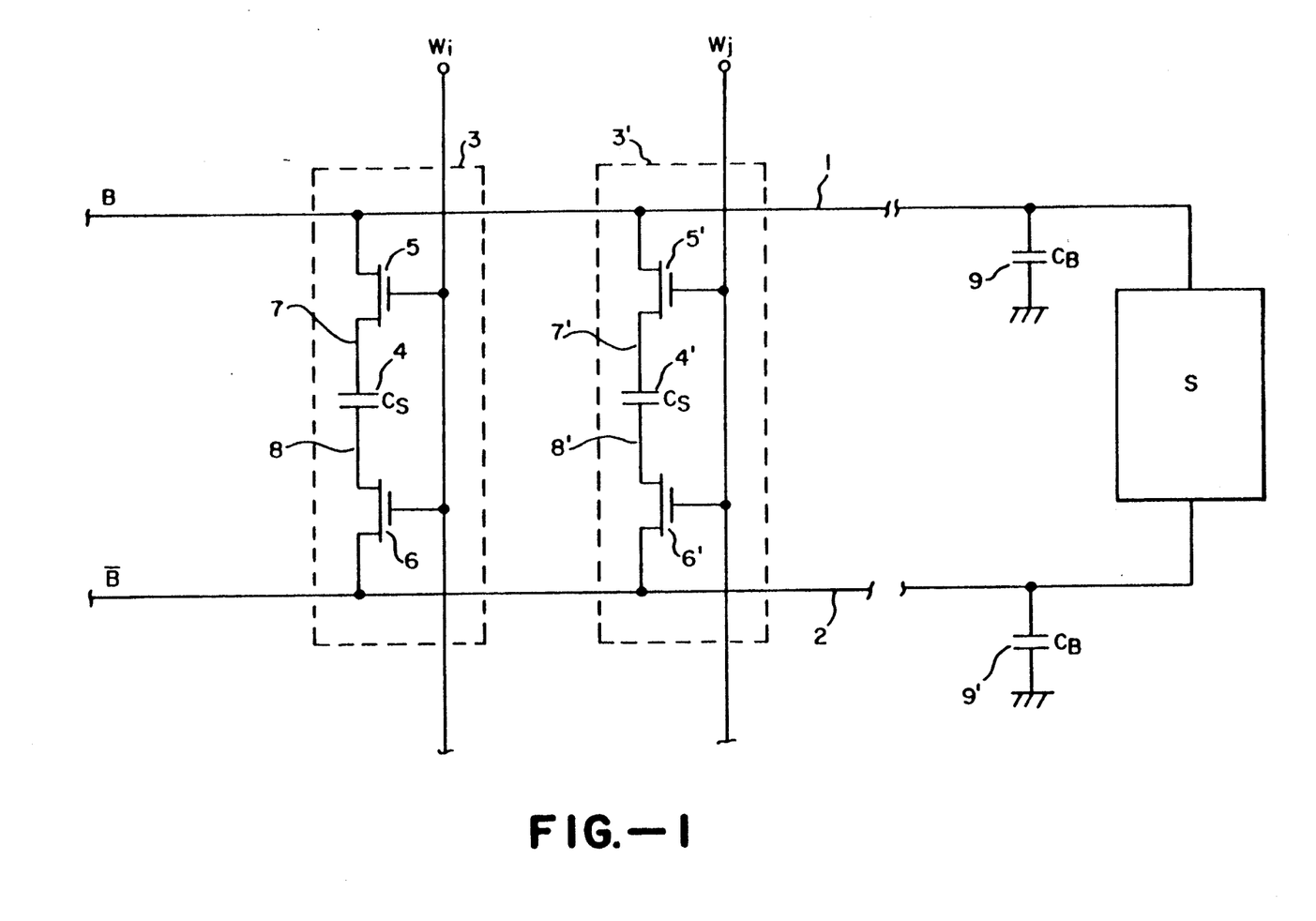
FIG. 1 is a circuit diagram formed with n-channel MOS circuits according to an embodiment of the present invention.

In FIG. 1 which shows a dynamic semiconductor memory according to an embodiment of the present invention, S indicates a sense amplifier, numerals 1 and 2 are mutually complementary first and second bit lines, numerals 3 and 3' are memory cells according to the present invention and $W_i$ and $W_j$ are word lines. Numerals 4 and 4' are storage capacitors, one end of which is connected to the first bit line 1 through the source-drain route of the respective one of transfer gates 5 and 5' which form a first selection means for selecting a desired memory cell while the other end is connected to the second bit line 2 through respective one of transfer gates 6 and 6' forming a second selection means for selecting a desired memory cell. The gates of the transfer gates 5 and 6 are both connected to the word line $W_i$ while those of the transfer gates 5' and 6' are both connected to the word line $W_j$. Numerals 9 and 9' are bit line capacitors respectively of the first and second bit lines 1 and 2. Capacitance of the memory cell capacitors 4 and 4' will be denoted by $C_S$ and that of the bit line capacitors will be denoted by $C_B$.

The operation of the dynamic semiconductor memory of FIG. 1 will be explained next with reference to the timing diagrams of FIGS. 2 through 5. Let us assume now that the first and second bit lines 1 and 2 are precharged to the source voltage $V_{CC}$ during a precharge period (when the precharge signal $\phi_p$ is at a high voltage). For convenience, furthermore, the bit lines 1 and 2 will sometimes be referred to as B and $\bar{B}$, respectively. The situation where B is at a high voltage and $\bar{B}$ is at a low voltage will be referred to as logical "1" and the situation where B is at a low voltage $\bar{B}$ and is at a high voltage will be referred to as logical "0". We will consider the situation where the memory cell 3 is selected.

Figure 2:
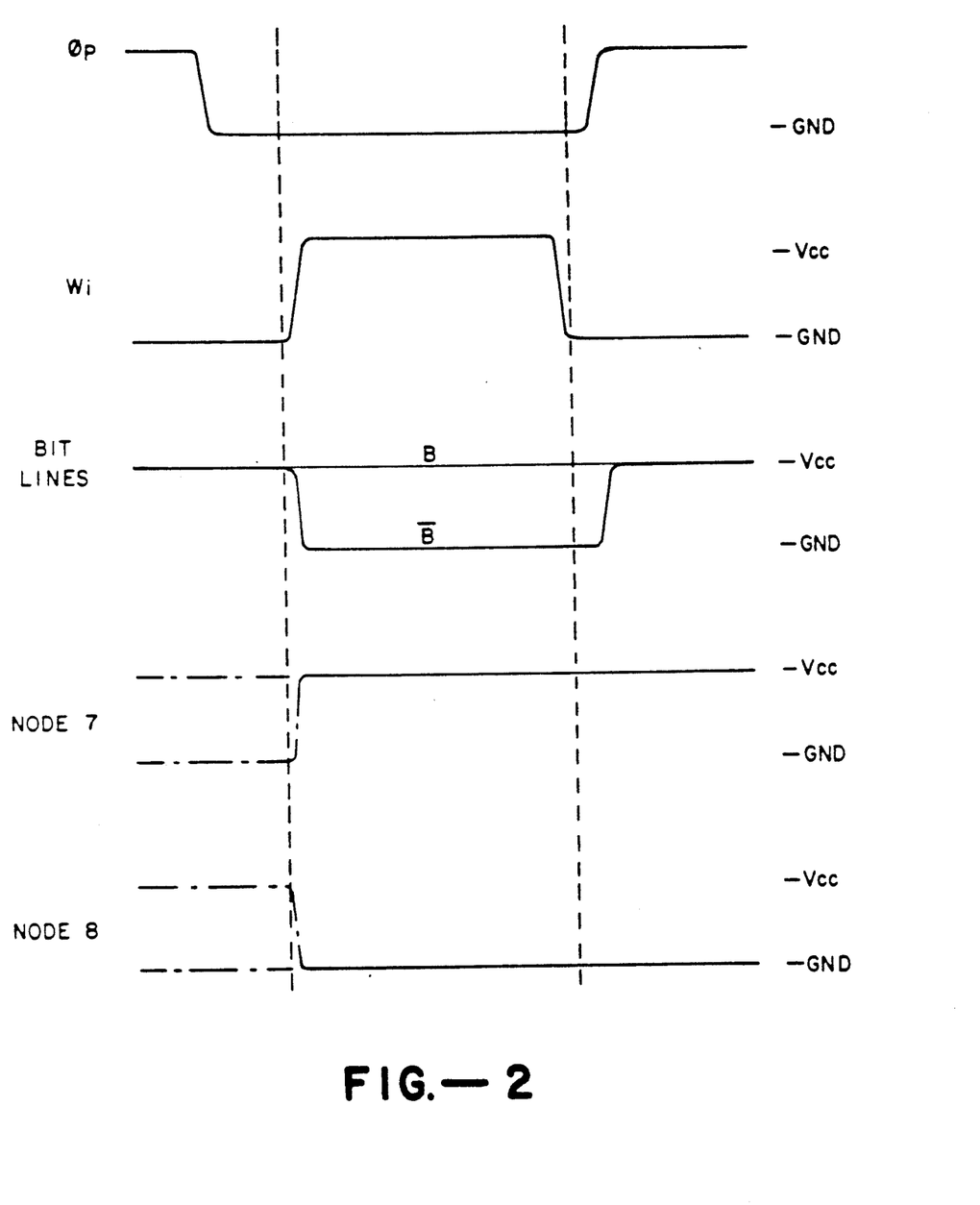
FIGS. 2 through 5 are timing diagrams for explaining the operation of the circuit of FIG. 1.

FIG. 2 shows timing diagrams for the case of writing logical "1". At the end of a precharge period, the precharge signal $\phi_p$ drops. An active period is entered and the memory cell 3 is selected when a selection signal higher than the source voltage $V_{CC}$ is applied to the word line $W_i$. When the source voltage $V_{CC}$ is applied to the bit line B and a ground level voltage GND to the bit line $\bar{B}$, the node 7 of the storage capacitor 4 reaches the source voltage $V_{CC}$ and the node 8 drops to the ground voltage level GND. This causes charges to be stored.

At the end of an active period when the voltage of the word line $W_i$ drops to the ground voltage level GND, the transfer gates 5 and 6 are cut off and the bit lines B and $\bar{B}$ are precharged to the source voltage $V_{CC}$, but since the nodes 7 and 8 are separated from the bit lines B and $\bar{B}$, no changes take place in their voltages and the charges stored in the capacitor 4 remain unchanged.

Figure 3:
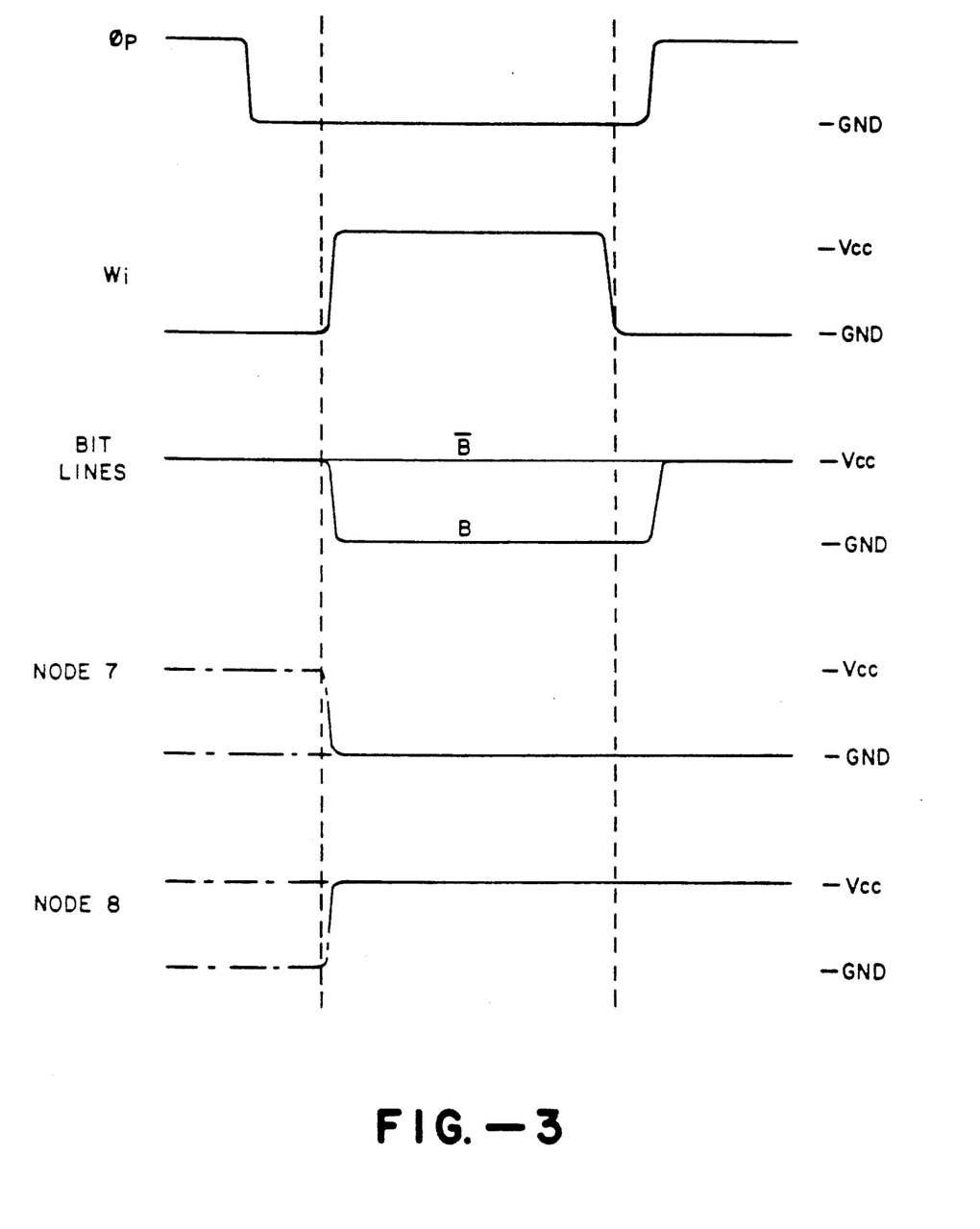

FIG. 3 shows timing diagrams for the case of writing logical "0". The memory cell 3 is selected as in the previous case of writing logical "1" and the ground voltage GND and the source voltage $V_{CC}$ are respectively applied to the bit lines B and $\bar{B}$. This causes the voltage at the nodes 7 and 8 of the storage capacitor 4 to reach the ground voltage level GND and the source voltage level $V_{CC}$, respectively. As a result, charges are accumulated and these charges remain unchanged after the end of the active period as explained above for the case of writing logical "1".

Figure 4:
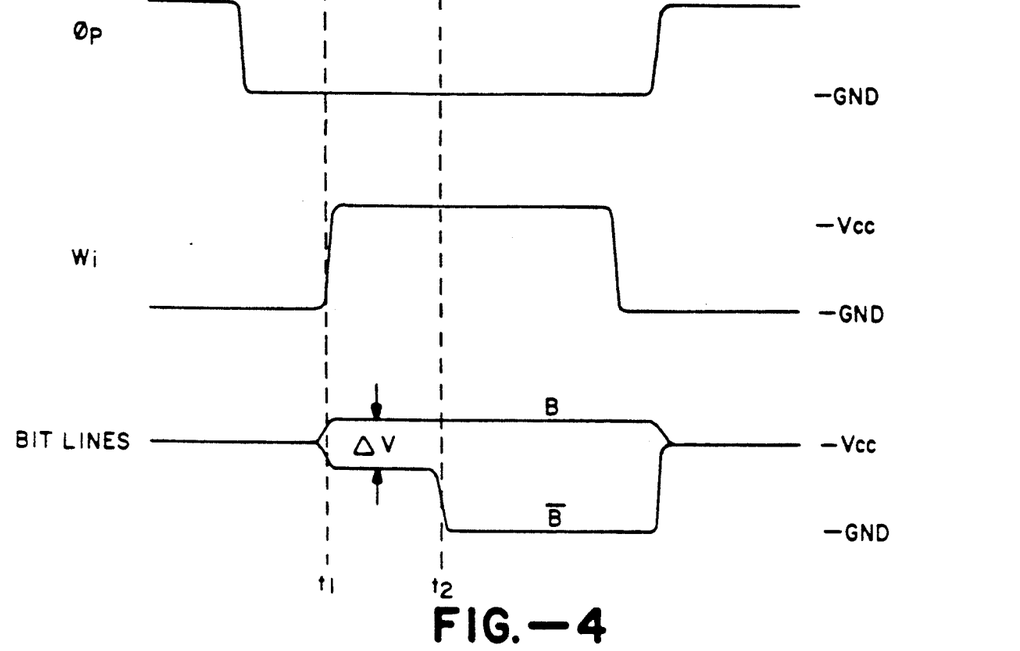

FIG. 4 shows timing diagrams for the case of reading of logical "1". When the precharge signal $\phi_p$ drops at the beginning of an active period, the bit lines B and $\bar{B}$ which have been precharged to the source voltage level $V_{CC}$ are cut off from the source and found in floating conditions. The memory cell 3 is selected when a selection signal higher than the source voltage $V_{CC}$ is applied to the word line $W_i$ at time $t_1$. In this situation, since the ground voltage GND has been applied to the node 8 of the memory cell 3, the voltage $V_{B2}$ of the bit line $\bar{B}$ drops to a level below the source voltage $V_{CC}$, and the voltage $V_{B1}$ of the bit line B reaches a level above the source voltage $V_{CC}$. At this point, $V_{B1}$ and $V_{B2}$ are respectively given by $V_{B1} = V_{CC}(C_B + 3C_S)/(C_B + 2C_S)$ and $V_{B2} = V_{CC}(C_B + C_S)/(C_B + 2C_S)$ so that the differential signal voltage $\Delta V$ inputted to the sense amplifier S is $$\Delta V = V_{B1} - V_{B2} = 2C_X V_{CC}/(C_B + 2C_S). \quad \text{Eq. (2)}$$

Thereafter, the sense amplifier S is activated at time $t_2$ to amplify the differential signal to a desired level and rewriting is effected into the storage capacitor 4.

Figure 5:
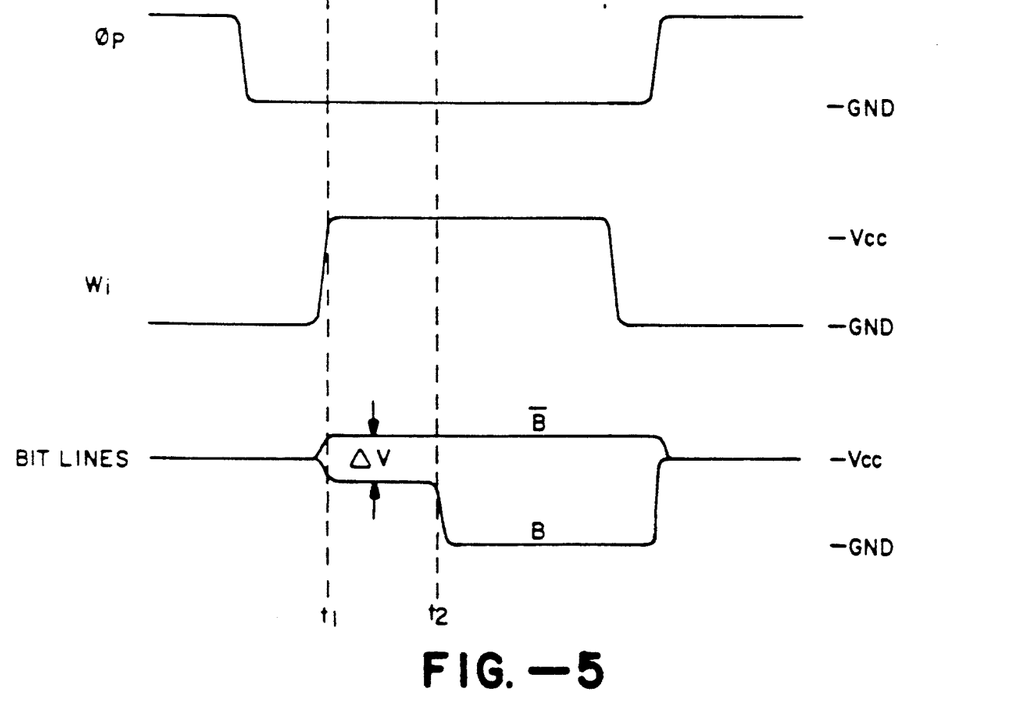

FIG. 5 shows timing diagrams for the case of reading logical "0". The memory cell 3 is again selected as in the case of reading logical "1". In this case, however, since the node 7 of the memory cell 3 has been at the ground voltage GND, the voltage $V_{B1}$ of the bit line B drops to a level below the source voltage $V_{CC}$ and the voltage $V_{B2}$ of the bit line $\bar{B}$ rises to a level above the source voltage $V_{CC}$. At this point, $V_{B1}$ and $V_{B2}$ are respectively given by $V_{B1} = V_{CC}(C_B + C_S)/(C_B + 2C_S)$ and $V_{B2} = V_{CC}(C_B + 3C_S)/(C_B + 2C_S)$ so that the differential signal voltage $\Delta V$ inputted to the sense amplifier S is $$\Delta V = V_{B2} - V_{B1} = 2C_S V_{CC}/(C_B + 2C_S). \quad \text{Eq. (3)}$$

This is the same as the expression for the case of reading logic "1". Thereafter, the sense amplifier S is activated for amplification as described above. Eqs. (1), (2) and (3) clearly show that the circuit embodying the present invention provides a much larger differential voltage.

Figure 6:
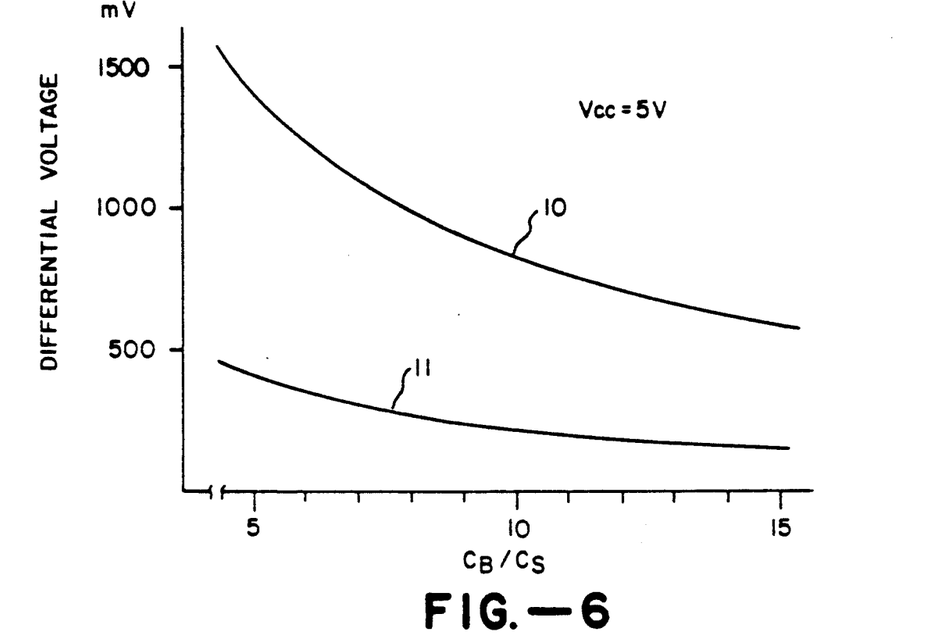
FIG. 6 is a graph for showing the difference in the differential signal voltage characteristics inputted to the sense amplifier between the present invention and the conventional method.

In FIG. 6 which is provided to show the differential voltage characteristics of a conventional circuit and a circuit embodying the present invention, numeral 10 represents the characteristic given by Eq. (3) and numeral 11 represents that of a conventional circuit given by Eq. (1). FIG. 6 shows that a differential voltage 3 times to nearly 4 times greater than that obtainable from a conventional circuit can be obtained in a practical range of $C_B/C_S (= 5-15)$.

In summary, the embodiment of the present invention described above allows one to obtain a very large differential voltage by using memory cells having the same storage capacitance. Alternatively, it allows the storage capacitance of memory cells to be much smaller for obtaining the same differential signal voltage. This means that the memory cell areas can be reduced.

Moreover, since no dummy cells are used, the problem of controlling the ratio of capacitance between the dummy cell and the memory cell can be obviated. Since the memory array becomes diminished and the peripheral circuits become simpler, this invention contributes significantly to the realization of large-scale dynamic memory elements with a wide action margin.

Figure 7:
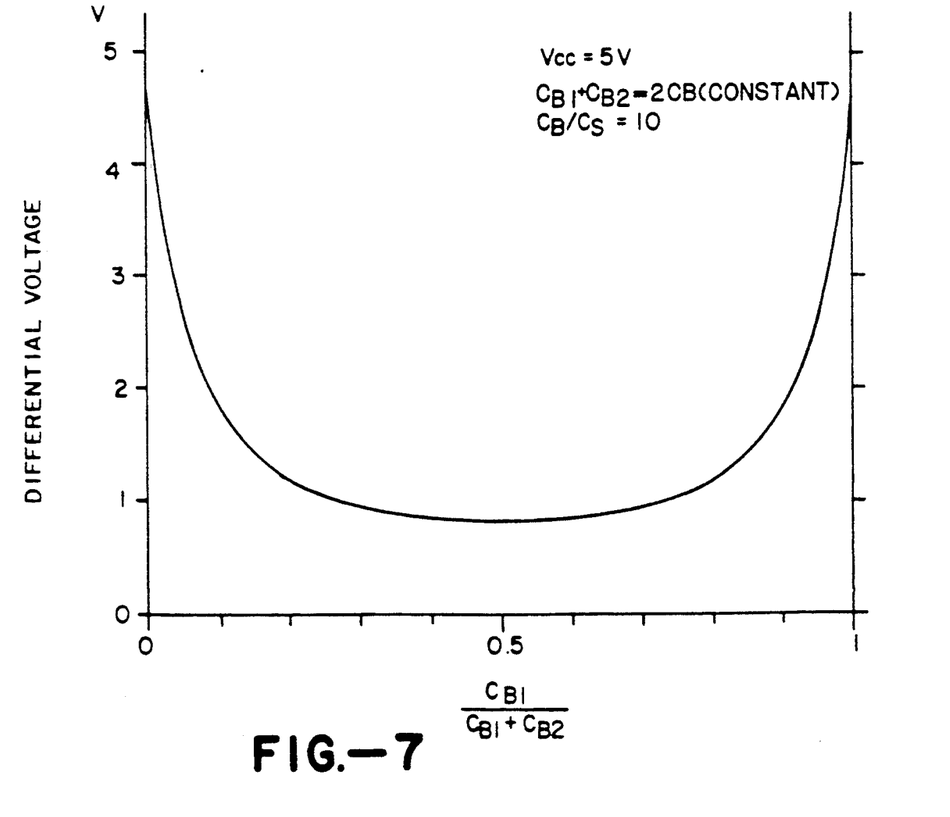
FIG. 7 is a graph for showing the relationship between the differential signal voltage and the ratio of load capacitance.

In order to simplify the description of the present invention, it was assumed above that the complementary bit lines have the same capacitance. This, however, does not limit the scope of this invention. In order to show this point more clearly, let $C_{B1}$ and $C_{B2}$ be respectively the capacitance of the first and second bit lines 1 and 2. FIG. 7 shows the differential signal voltage characteristic inputted to the sense amplifier S as the ratio between $C_{B1}$ and $C_{B2}$ is varied under the condition $C_{B1}+C_{B2}=2C_B$ and when $C_B C_S = 10$.

FIG. 7 shows clearly that the differential signal voltage increases as the difference between $C_{B1}$ and $C_{B2}$ is made larger under the condition that their sum stays the same. This means that the advantageous effect of the present invention can be maximally utilized if the capacitance of one of the bit lines is made as small as possible. This is a very significant discovery resulting from this invention, especially in view of the fact that the load capacitance of the complementary bit lines in a conventional memory had to be made equal to each other. As a result, the present invention increases the degree of freedom significantly in designing patterns.

In the above, furthermore, n-channel MOS circuits were used for explaining the present invention. This invention, however, is not limited by the production process of its elements. The present invention can be applied equally well to the p-channel MOS process, CMOS process, SOI process, bipolar process, etc.

What is claimed is:

1. A dynamic semiconductor memory with memory cell structure comprising a first bit line with load capacitance $C_1$ and a second bit line with load capacitance $C_2$ for inputting and outputting information, said bit lines being complementary to each other, storage capacitor means for storing information, said storage capacitor having capacitance $C_S$, and a first selection means and a second selection means for specifying said storage capacitor means, one end of said storage capacitor means being connected to said first bit line through said first selection means and the other end of said storage capacitor means being connected to said second bit line through said second selection means, wherein $C_1$ and $C_2$ are significantly different from each other, and the voltages of said first and second bit lines depend on $C_1$, $C_2$ and $C_S$.

2. The dynamic semiconductor memory of claim 1 wherein the quotient $C_1/(C_1+C_2)$ is nearly equal to 0 or 1.

* * * * *